(12) United States Patent
Khlat (10) Patent No.: US 10,951,175 B2
(45) Date of Patent: Mar. 16, 2021

(54) ENVELOPE TRACKING CIRCUIT AND RELATED POWER AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 11 days.

(21) Appl. No.: 16/250,229

(22) Filed: Jan. 17, 2019

(65) Prior Publication Data

US 2020/0076375 A1    Mar. 5, 2020

Related U.S. Application Data

(60) Provisional application No. 62/726,572, filed on Sep. 4, 2018.

(51) Int. Cl.
  *H03F 1/32* (2006.01)
  *H03F 3/21* (2006.01)
  *H03F 1/02* (2006.01)

(52) U.S. Cl.
  CPC ............. *H03F 1/32* (2013.01); *H03F 1/0238* (2013.01); *H03F 3/21* (2013.01); *H03F 2200/102* (2013.01); *H03F 2200/129* (2013.01); *H03F 2200/451* (2013.01); *H03F 2201/3215* (2013.01)

(58) Field of Classification Search
  USPC .... 330/136, 297, 279, 295, 124 R, 134, 290
  See application file for complete search history.

(56) References Cited

U.S. PATENT DOCUMENTS

| | | |
|---|---|---|
| 6,529,716 B1 | 3/2003 | Eidson et al. |
| 6,788,151 B2 | 9/2004 | Shvarts et al. |
| 8,019,289 B2 | 9/2011 | Gorbachov |
| 8,290,453 B2 | 10/2012 | Yoshihara |
| 8,385,859 B2 | 2/2013 | Hamano |
| 8,476,976 B2 | 7/2013 | Wimpenny |
| 8,598,950 B2 | 12/2013 | Khesbak |
| 8,600,321 B2 | 12/2013 | Nambu et al. |

(Continued)

OTHER PUBLICATIONS

Non-Final Office Action for U.S. Appl. No. 16/263,368, dated Dec. 26, 2019, 6 pages.

(Continued)

*Primary Examiner* — Hieu P Nguyen (74) *Attorney, Agent, or Firm* — Withrow & Terranova, P.L.L.C.

(57) ABSTRACT

An envelope tracking (ET) circuit and related power amplifier apparatus is provided. An ET power amplifier apparatus includes an ET circuit and a number of amplifier circuits. The ET circuit is configured to provide a number of ET modulated voltages to the amplifier circuits for amplifying concurrently a number of radio frequency (RF) signals. The ET circuit includes a target voltage circuit for generating a number of ET target voltages adapted to respective power levels of the RF signals and/or respective impedances seen by the amplifier circuits, a supply voltage circuit for generating a number of constant voltages, and an ET voltage circuit for generating the ET modulated voltages based on the ET target voltages and a selected one of the constant voltages. By employing a single ET circuit, it may be possible to reduce footprint and improve heat dissipation of the ET power amplifier apparatus.

25 Claims, 6 Drawing Sheets

(56) References Cited

U.S. PATENT DOCUMENTS

| | | |
|---|---|---|
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1* | 6/2015 | Yan .............. H04B 1/0475 |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2* | 12/2016 | Nentwig .............. H03F 1/0277 |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1* | 4/2017 | Rozenblit .............. H03F 1/0227 |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 | 8/2014 | Wimpenny |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |

OTHER PUBLICATIONS

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

U.S. Appl. No. 16/193,513, filed Nov. 16, 2018.

U.S. Appl. No. 16/267,740, filed Feb. 5, 2019.

U.S. Appl. No. 16/263,316, filed Jan. 31, 2019.

U.S. Appl. No. 16/270,119, filed Feb. 7, 2019.

U.S. Appl. No. 16/273,288, filed Feb. 12, 2019.

U.S. Appl. No. 16/278,886, filed Feb. 19, 2019.

U.S. Appl. No. 16/250,298, filed Jan. 17, 2019.

U.S. Appl. No. 16/267,779, filed Feb. 5, 2019.

U.S. Appl. No. 16/263,368, filed Jan. 31, 2019.

Notice of Allowance for U.S. Appl. No. 16/193,513, dated Mar. 25, 2020, 8 pages.

Non-Final Office Action for U.S. Appl. No. 16/267,740, dated Apr. 30, 2020, 10 pages.

Final Office Action for U.S. Appl. No. 16/263,316, dated May 13, 2020, 10 pages.

Notice of Allowance for U.S. Appl. No. 16/270,119, dated Jun. 18, 2020, 9 pages.

(56) References Cited

OTHER PUBLICATIONS

Non-Final Office Action for U.S. Appl. No. 16/278,886, dated Apr. 29, 2020, 9 pages.
Quayle Action for U.S. Appl. No. 16/267,779, mailed May 1, 2020, 8 pages.
Final Office Action for U.S. Appl. No. 16/263,368, dated May 22, 2020, 9 pages.
Non-Final Office Action for U.S. Appl. No. 16/263,316, dated Jul. 17, 2020, 4 pages.
Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Quayle Action for U.S. Appl. No. 16/267,740, dated Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,768, dated Oct. 27, 2020, 9 pages.
Quayle Action for U.S. Appl. No. 16/514,339, dated Nov. 19, 2020, 9 pages.

* cited by examiner

ENVELOPE TRACKING CIRCUIT AND RELATED POWER AMPLIFIER APPARATUS

RELATED APPLICATIONS

This application claims the benefit of provisional patent application Ser. No. 62/726,572, filed Sep. 4, 2018, the disclosure of which is hereby incorporated herein by reference in its entirety.

This application is related to U.S. patent application Ser. No. 16/250,298, filed Jan. 17, 2019, entitled "ENVELOPE TRACKING CIRCUIT AND RELATED POWER AMPLIFIER APPARATUS," the disclosure of which is hereby incorporated herein by reference in its entirety.

FIELD OF THE DISCLOSURE

The technology of the disclosure relates generally to an envelope tracking (ET) power amplifier apparatus and an ET circuit therein.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve the higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experiences.

Envelope tracking (ET) is a power management technology designed to improve efficiency levels of the power amplifier(s) to help reduce power consumption and thermal dissipation in the mobile communication device. As the name suggests, an ET circuit(s) can be configured to keep track of a time-variant power envelope(s) of the mmWave RF signal(s) communicated by the mobile communication device. As such, the ET circuit(s) can constantly adjust a voltage(s) supplied to the power amplifier(s) based on an instantaneous power level of the mmWave RF signal(s) to improve linearity and efficiency of the power amplifier(s).

Notably, the mmWave RF signal(s) can be susceptible to attenuation and interference resulting from various sources. As such, the mobile communication device may employ multiple transmitters/antennas to simultaneously transmit a number of mmWave RF signals via a technique known as RF beamforming. Given that the mmWave RF signals may be associated with different time-variant power envelopes, it may be necessary to have multiple power amplifiers for amplifying simultaneously the multiple mmWave RF signals. Accordingly, it may also be necessary to employ multiple ET circuits to supply simultaneously multiple voltages to the multiple power amplifiers. As a result, the mobile communication device may require a larger footprint for accommodating the multiple ET circuits. Furthermore, the increased number of ET circuits may also lead to increased complexity and heat dissipation in the mobile communication device. Hence, it may be desired to support RF beamforming in the mobile communication device without increasing the number of the ET circuits.

SUMMARY

Embodiments of the disclosure relate to an envelope tracking (ET) circuit and related power amplifier apparatus. In one aspect, an ET power amplifier apparatus includes an ET circuit and a number of amplifier circuits. The ET circuit is configured to provide a number of ET modulated voltages to the amplifier circuits for amplifying concurrently a number of radio frequency (RF) signals to respective power levels. In another aspect, the ET circuit is configured to include a target voltage circuit, a supply voltage circuit, and an ET voltage circuit. The target voltage circuit is configured to generate a number of ET target voltages adapted to the respective power levels of the RF signals and/or respective impedances seen by the amplifier circuits. The supply voltage circuit is configured to generate a number of constant voltages. The ET voltage circuit is configured to generate the ET modulated voltages based on the ET target voltages and a selected one of the constant voltages. As such, it may be possible to adapt the ET modulated voltages to the respective power levels of the RF signals and/or respective impedances seen by the amplifier circuits, thus helping to improve linearity and efficiency of the amplifier circuits. Further, by providing the ET modulated voltages from a single ET circuit, it may be possible to reduce the footprint and improve heat dissipation of the ET power amplifier apparatus.

In one aspect, an ET circuit is provided. The ET circuit includes a supply voltage circuit configured to generate a number of constant voltages. The ET voltage includes a target voltage circuit configured to generate a number of ET target voltages based on a reference target voltage. The ET voltage includes an ET voltage circuit. The ET voltage circuit is configured to receive the constant voltages from the supply voltage circuit. The ET voltage circuit is also configured to receive the ET target voltages from the target voltage circuit. The ET voltage circuit is also configured to generate a number of ET modulated voltages based on the ET target voltages and a selected constant voltage among the constant voltages.

In another aspect, an ET power amplifier apparatus is provided. The ET power amplifier apparatus includes a number of amplifier circuits configured to amplify an RF signal based on a number of ET modulated voltages, respectively. The ET power amplifier apparatus also includes an ET circuit coupled to the amplifier circuits. The ET circuit includes a supply voltage circuit configured to generate a number of constant voltages. The ET voltage includes a target voltage circuit configured to generate the ET target voltages based on a reference target voltage. The ET voltage includes an ET voltage circuit. The ET voltage circuit is configured to receive the constant voltages from the supply voltage circuit. The ET voltage circuit is also configured to receive the ET target voltages from the target voltage circuit. The ET voltage circuit is also configured to generate a number of ET modulated voltages based on the ET target voltages and a selected constant voltage among the constant voltages.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) circuit and related power amplifier apparatus. In one aspect, an ET power amplifier apparatus includes an ET circuit and a number of amplifier circuits. The ET circuit is configured to provide a number of ET modulated voltages to the amplifier circuits for amplifying concurrently a number of radio frequency (RF) signals to respective power levels. In another aspect, the ET circuit is configured to include a target voltage circuit, a supply voltage circuit, and an ET voltage circuit. The target voltage circuit is configured to generate a number of ET target voltages adapted to the respective power levels of the RF signals and/or respective impedances seen by the amplifier circuits. The supply voltage circuit is configured to generate a number of constant voltages. The ET voltage circuit is configured to generate the ET modulated voltages based on the ET target voltages and a selected one of the constant voltages. As such, it may be possible to adapt the ET modulated voltages to the respective power levels of the RF signals and/or respective impedances seen by the amplifier circuits, thus helping to improve linearity and efficiency of the amplifier circuits. Further, by providing the ET modulated voltages from a single ET circuit, it may be possible to reduce the footprint and improve heat dissipation of the ET power amplifier apparatus.

Figure 1:
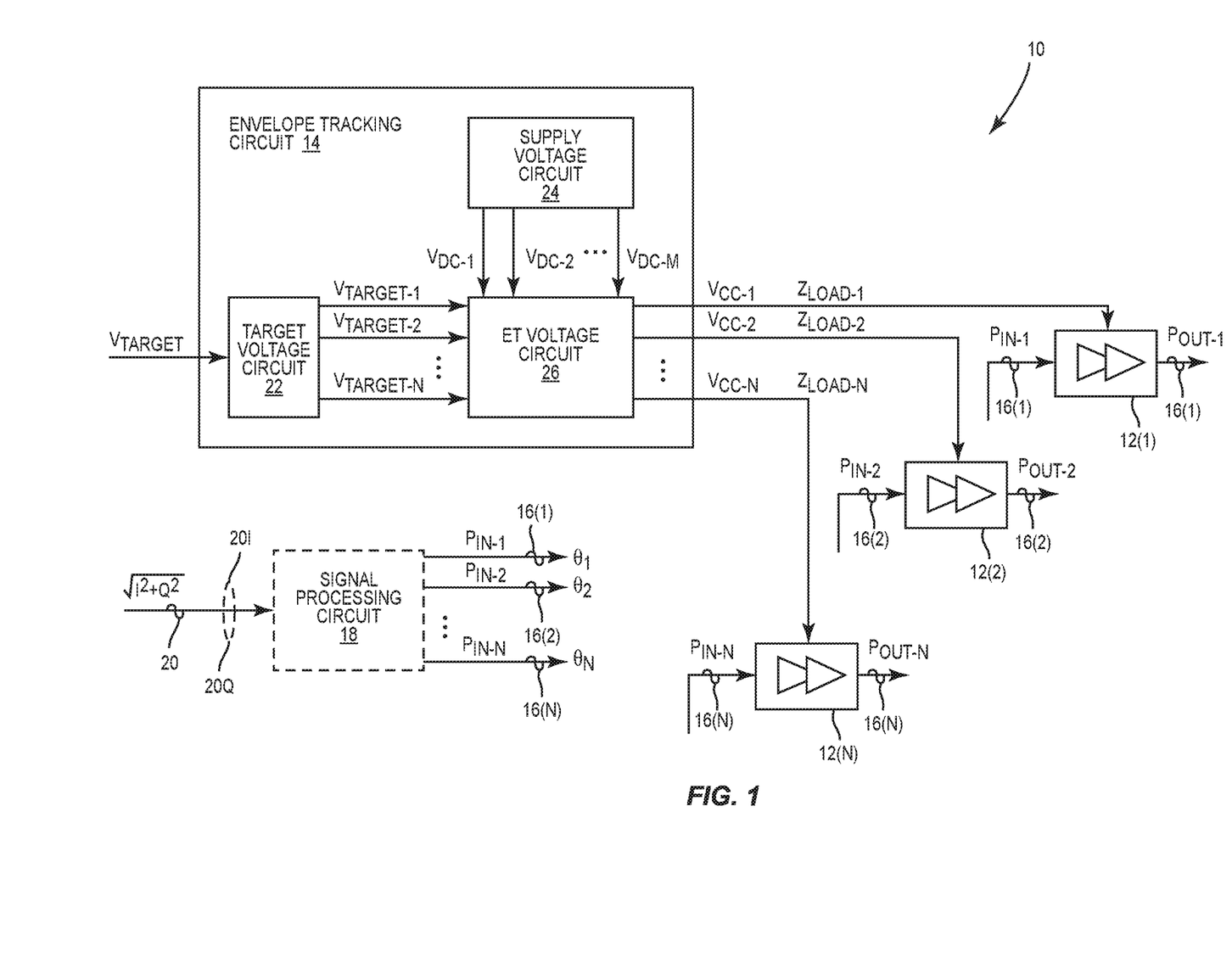
FIG. 1 is a schematic diagram of an exemplary envelope tracking (ET) power amplifier apparatus configured according to an embodiment of the present disclosure to support a number of amplifier circuits based on a single ET circuit.

In this regard, FIG. 1 is a schematic diagram of an exemplary ET power amplifier apparatus 10 configured according to an embodiment of the present disclosure to support a number of amplifier circuits 12(1)-12(N) based on an ET circuit 14. The amplifier circuits 12(1)-12(N) may be configured to amplify a number of RF signals 16(1)-16(N) from input powers $P_{IN-1}$-$P_{IN-N}$ to output powers $P_{OUT-1}$-$P_{OUT-N}$, respectively. In a non-limiting example, the amplifier circuits 12(1)-12(N) are coupled to a signal processing circuit 18. The signal processing circuit 18 may be configured to receive a digital signal 20, which may include a digital in-phase (I) signal 20I and a digital quadrature (Q) signal 20Q. Accordingly, the digital signal 20 corresponds to a time-variant signal envelope $\sqrt{I^2+Q^2}$, wherein I and Q represent time-variant in-phase amplitude and quadrature amplitude of the digital signal 20, respectively.

The signal processing circuit 18 is configured to convert the digital signal 20 into the RF signals 16(1)-16(N). More specifically, the signal processing circuit 18 may be configured to pre-process the RF signal 16(1)-16(N) to the input powers $P_{IN-1}$-$P_{IN-N}$ and/or phase angles $\theta_1$-$\theta_N$, respectively, such that the RF signals 16(1)-16(N) can be transmitted coherently via RF beamforming.

The ET circuit 14 is configured to generate and provide a number of ET modulated voltages $V_{CC-1}$-$V_{CC-N}$ to the amplifier circuits 12(1)-12(N), respectively. In examples discussed herein, the ET modulated voltages $V_{CC-1}$-$V_{CC-N}$ may be generated in accordance to the input powers $P_{IN-1}$-$P_{IN-N}$ of the RF signals 16(1)-16(N) and/or load impedances $Z_{LOAD-1}$-$Z_{LOAD-N}$ as seen from the amplifier circuits 12(1)-12(N) into the ET circuit 14. As such, it may be possible to improve linearity and efficiency of the amplifier circuits 12(1)-12(N). Further, by employing only the ET circuit 14 for generating the ET modulated voltages $V_{CC-1}$-$V_{CC-N}$, as opposed to employing multiple ET circuits, it may be possible to reduce footprint and heat dissipation in the ET power amplifier apparatus 10.

The ET circuit includes a target voltage circuit 22, a supply voltage circuit 24, and an ET voltage circuit 26. The target voltage circuit 22 is configured to receive a reference target voltage $V_{TARGET}$ and generate a number of ET target voltages $V_{TARGET-1}$-$V_{TARGET-N}$ based on the reference target voltage $V_{TARGET}$. The target voltage circuit 22 will be further discussed in detail in reference to FIG. 2 below.

The supply voltage circuit 24 is configured to generate a number of constant voltages $V_{DC1}$-$V_{DC-M}$. The supply voltage circuit 24 will be further discussed in detail in reference to FIG. 3 below.

The ET voltage circuit 26 is coupled to the target voltage circuit 22 and the supply voltage circuit 24. The ET voltage circuit 26 is configured to receive the ET target voltages $V_{TARGET-1}$-$V_{TARGET-N}$ from the target voltage circuit 22 and the constant voltages $V_{DC-1}$-$V_{DC-N}$ from the supply voltage circuit 24. As discussed in detail in FIGS. 4A-4C, the ET voltage circuit 26 can be configured according to various embodiments of the present disclosure to generate the ET modulated voltages $V_{CC-1}$-$V_{CC-N}$ based on the ET target voltages $V_{TARGET-1}$-$V_{TARGET-N}$ and a selected constant voltage among the constant voltages $V_{DC-1}$-$V_{DC-N}$.

Figure 2:
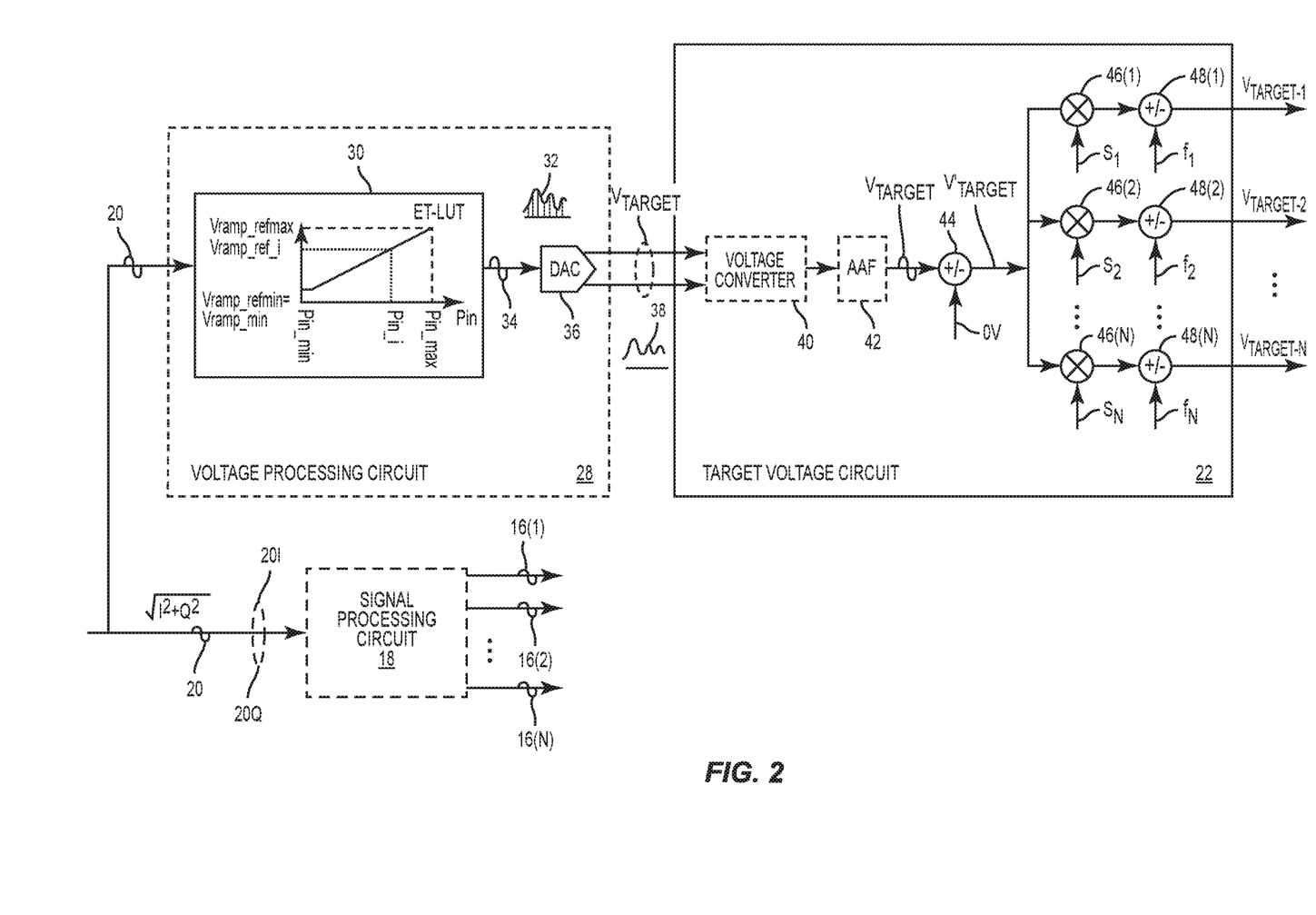
FIG. 2 is a schematic diagram providing an exemplary illustration of a target voltage circuit in the ET circuit of FIG. 1 configured according to an embodiment of the present disclosure to generate a number of ET target voltages.

FIG. 2 is a schematic diagram providing an exemplary illustration of the target voltage circuit 22 of FIG. 1 configured according to an embodiment of the present disclosure to generate the ET target voltages $V_{TARGET-1}$-$V_{TARGET-N}$. Common elements between FIGS. 1 and 2 are shown therein with common element numbers and will not be re-described herein.

The target voltage circuit 22 may be coupled to a voltage processing circuit 28, which is further coupled to the signal processing circuit 18. In this regard, the voltage processing circuit 28 receives the digital signal 20 that corresponds to the time-variant amplitude envelope $\sqrt{I^2+Q^2}$. The voltage processing circuit 28 includes an ET look-up table (LUT) 30 configured to store predetermined correlations between the time-variant amplitude envelope $\sqrt{I^2+Q^2}$ and a time-variant voltage envelope 32 associated with a digital target voltage signal 34. The voltage processing circuit 28 may include a digital-to-analog converter (DAC) 36 for converting the digital target voltage signal 34 into the reference target voltage $V_{TARGET}$, which corresponds to a time-variant target voltage envelope 38 that tracks (e.g., rises and falls) the time-variant voltage envelope 32 as well as the time-variant amplitude envelope $\sqrt{I^2+Q^2}$. In this regard, the reference target voltage $V_{TARGET}$ corresponds to a dynamic voltage range defined by a maximum level target voltage $V_{MAX-TARGET}$ and a minimum level target voltage $V_{MIN-TARGET}$ (dynamic voltage range=$V_{MAX-TARGET}$-$V_{MIN-TARGET}$) of the time-variant voltage envelope 32.

In a non-limiting example, the reference target voltage $V_{TARGET}$ can be a differential voltage signal. As such, the target voltage circuit 22 may include a voltage converter 40 for converting the differential target voltage signal to the reference target voltage $V_{TARGET}$. The target voltage circuit 22 may also include an anti-alias filter (AAF) 42 for aliasing the reference target voltage $V_{TARGET}$.

The target voltage circuit 22 includes a first offset converter 44 configured to convert the reference target voltage $V_{TARGET}$ to a baseline reference voltage $V'_{TARGET}$ (e.g., 0 V) corresponding to the dynamic voltage range ($V_{MAX-TARGET}$-$V_{MIN-TARGET}$). The target voltage circuit 22 includes a number of multipliers 46(1)-46(N) coupled in parallel to the first offset converter 44 to receive the baseline reference voltage $V'_{TARGET}$. The multipliers 46(1)-46(N) can be configured to multiply a dynamic voltage range with a number of slope factors $S_1$-$S_N$ to generate the ET target voltages $V_{TARGET-1}$-$V_{TARGET-N}$, respectively. In a non-limiting example, the slope factors $S_1$-$S_N$ can be determined based on the equation (Eq. 1) below.

$$S_i=(V_{MAX-TARGET-i}-V_{MIN-TARGET-i})/(V_{MAX-TARGET}-V_{MIN-TARGET})(1 \leq i \leq N) \qquad (Eq.\ 1)$$

In the equation above, $V_{MAX-TARGET-i}$ and $V_{MIN-TARGET-i}$ represent a maximum level and a minimum level of the ET target voltage $V_{TARGET-i}$ ($1 \leq i \leq N$) as defined in the ET LUT 30, respectively. ($V_{MAX-TARGET}-V_{MIN-TARGET}$) represents the dynamic voltage range of the reference target voltage $V_{TARGET}$. The target voltage circuit 22 includes a number of second offset converters 48(1)-48(N) coupled to the multipliers 46(1)-46(N), respectively. The second offset converters 48(1)-48(N) are configured to adjust the ET target voltages $V_{TARGET-1}$-$V_{TARGET-N}$ based on a number of offset factors $f_1$-$f_N$, respectively. In this regard, each of the ET target voltages $V_{TARGET-1}$-$V_{TARGET-N}$ may be generated based on the equation (Eq. 2) below.

$$V_{TARGET-i}=S_i*(V_{MAX-TARGET}-V_{MIN-TARGET})+f_i \\ (1 \leq i \leq N) \qquad (Eq.\ 2)$$

Figure 3:
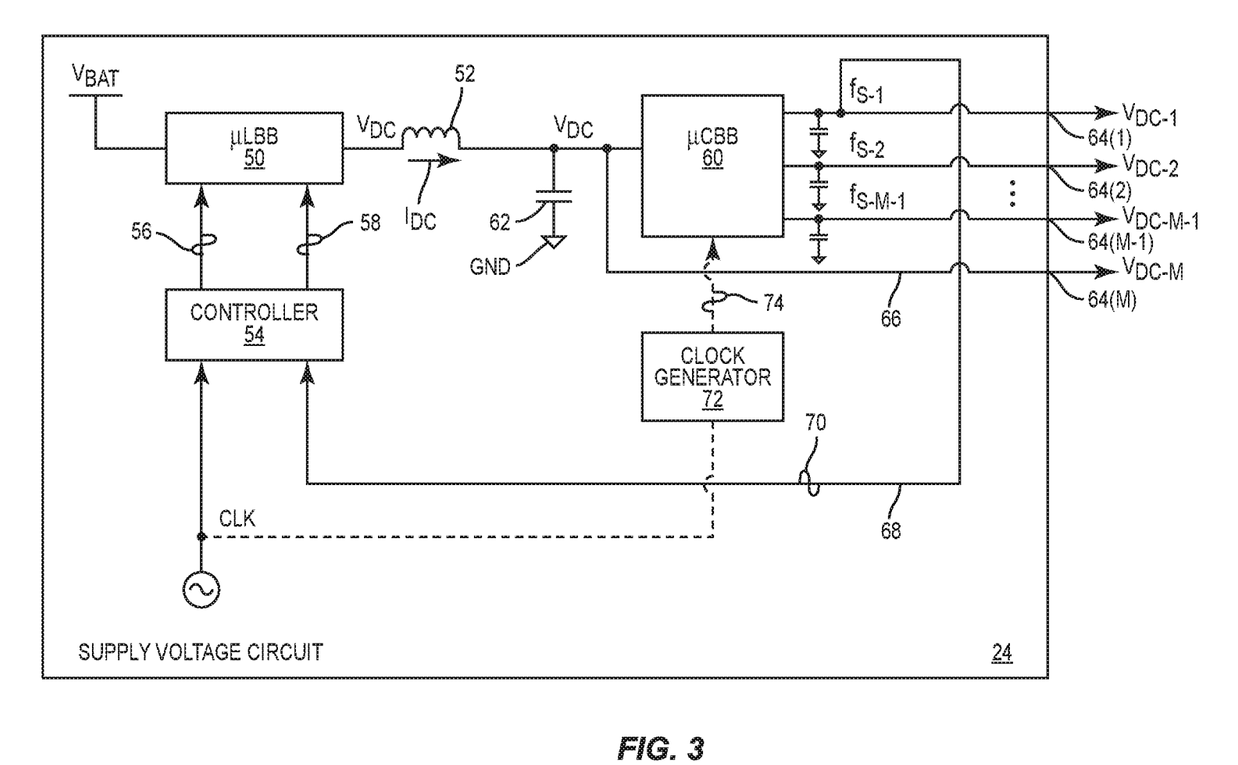
FIG. 3 is a schematic diagram providing an exemplary illustration of a supply voltage circuit in the ET circuit of FIG. 1 configured according to an embodiment of the present disclosure to generate a number of constant voltages.

FIG. 3 is a schematic diagram providing an exemplary illustration of the supply voltage circuit 24 of FIG. 1 configured according to an embodiment of the present disclosure to generate the constant voltages $V_{DC-1}$-$V_{DC-M}$. Common elements between FIGS. 1 and 3 are shown therein with common element numbers and will not be re-described herein.

The supply voltage circuit 24 includes an inductor-based voltage circuit 50 (denoted as "μLBB"), which is configured to generate a direct current (DC) voltage $V_{DC}$ based on a battery voltage $V_{BAT}$. The inductor-based voltage circuit 50 is coupled to an inductor 52, which is configured to induce a DC current $I_{DC}$ based on the DC voltage $V_{DC}$. In a non-limiting example, the inductor-based voltage circuit 50 can be a buck-boost circuit configured to operate in a buck mode to generate the DC voltage $V_{DC}$ as being less than or equal to the battery voltage $V_{BAT}$ or in a boost mode to generate the DC voltage $V_{DC}$ as being greater than the battery voltage $V_{BAT}$. In this regard, the supply voltage circuit 24 may include a controller 54, which can be a pulse width modulation (PWM) controller for example, configured to control the inductor-based voltage circuit 50. Specifically, the controller 54 may control the inductor-based voltage circuit 50 to operate in the buck mode and the boost mode based on a first control signal 56 and a second control signal 58, respectively.

The inductor-based voltage circuit 50 is coupled to a capacitor-based voltage circuit 60 (denoted as "μCBB"). A capacitor 62 may be provided in between the inductor-based voltage circuit 50 and the capacitor-based voltage circuit 60. The capacitor 62 has one end coupled to a ground GND and another end coupled in between the inductor-based voltage circuit 50 and the capacitor-based voltage circuit 60.

The supply voltage circuit 24 includes a number of output ports 64(1)-64(M) configured to output the constant voltages $V_{DC-1}$-$V_{DC-M}$, respectively. In one exemplary embodiment, a first selected output port 64(M) is coupled to the inductor-based voltage circuit 50 via a conductive line 66 directly. Accordingly, the first selected output port 64(M) outputs the DC voltage $V_{DC}$ as a first selected constant voltage $V_{DC-M}$ among the constant voltages $V_{DC-1}$-$V_{DC-M}$. According to the exemplary embodiment, one or more second selected output ports 64(1)-64(M−1) are coupled to the capacitor-based voltage circuit 60. Accordingly, the second selected output ports 64(1)-64(M−1) are configured to output one or more second selected constant voltages $V_{DC-1}$-$V_{DC-M-1}$, respectively.

In this regard, the capacitor-based voltage circuit 60 is configured to generate the second selected constant voltages $V_{DC-1}$-$V_{DC-M-1}$ based on the DC voltage $V_{DC}$. In a non-limiting example, the capacitor-based voltage circuit 60 can generate the second selected constant voltages $V_{DC-1}$-$V_{DC-M-1}$ by multiplying the DC voltage $V_{DC}$ with one or more predefined scaling factors $f_{S-1}$-$f_{S-M-1}$, respectively. In this regard, each of the second selected constant voltages $V_{DC-1}$-$V_{DC-M-1}$ can be determined based on the equation (Eq. 3) below.

$$V_{DC-i} = V_{DC} * f_{S-1} \quad (1 \leq i \leq M-1) \qquad (Eq.3)$$

In one embodiment, each of the predefined scaling factors $f_{S-1}$-$f_{S-M-1}$ can be a fractional scaling factor lesser than one (1). In this regard, each of the second selected constant voltages $V_{DC-1}$-$V_{DC-M-1}$ is lesser than the first selected constant voltage $V_{DC-M}$. Accordingly, the capacitor-based voltage circuit 60 can be configured to operate exclusively in the buck mode. In a non-limiting example, the constant voltages $V_{DC-1}$-$V_{DC-M}$ can be outputted from the output ports 64(1)-64(M) based on ascending voltage values ($V_{DC-1} \leq V_{DC-2} \leq \ldots \leq V_{DC-M-1} \leq V_{DC-M}$).

In one embodiment, each of the predefined scaling factors $f_{S-1}$-$f_{S-M-1}$ can be greater than 1. In this regard, each of the second selected constant voltages $V_{DC-1}$-$V_{DC-M-1}$ is greater than the first selected constant voltage $V_{DC-M}$. Accordingly, the capacitor-based voltage circuit 60 can be configured to operate exclusively in the boost mode.

In one embodiment, each of the predefined scaling factors $f_{S-1}$-$f_{S-M-1}$ can be either greater than 1 or lesser than 1. In this regard, each of the second selected constant voltages $V_{DC-1}$-$V_{DC-M-1}$ can be greater than the first selected constant voltage $V_{DC-M}$ or lesser than the first selected constant voltage $V_{DC-M}$. Accordingly, the capacitor-based voltage circuit 60 can be configured to operate in both the buck mode and the boost mode (buck-boost mode).

The supply voltage circuit 24 includes a voltage feedback line 68 coupled from one of the second selected output ports 64(1)-64(M−1) to the controller 54. The voltage feedback line 68 is configured to carry the voltage feedback signal 70 indicative of a preselected constant voltage among the second selected constant voltages $V_{DC-1}$-$V_{DC-M-1}$. In a non-limiting example, the voltage feedback line 68 can be coupled from the output port 64(1) to the controller 54. The voltage feedback line 68 is configured to carry a voltage feedback signal 70 indicative of the preselected constant voltage $V_{DC-1}$. Since all of the second selected constant voltages $V_{DC-1}$-$V_{DC-M}$ are related to the DC voltage $V_{DC}$, the voltage feedback signal 70 can be used to further indicate all of the second selected constant voltages $V_{DC-1}$-$V_{DC-M}$. Accordingly, the controller 54 may control the inductor-based voltage circuit 50 to adjust the DC voltage $V_{DC}$ based on the voltage feedback signal 70.

The supply voltage circuit may include a clock generator 72 configured to generate an operating clock 74 for the capacitor-based voltage circuit 60. In a non-limiting example, the clock generator 72 can generate the operating clock 74 based on a reference clock CLK that is also configured to operate the controller 54.

Figure 4A:
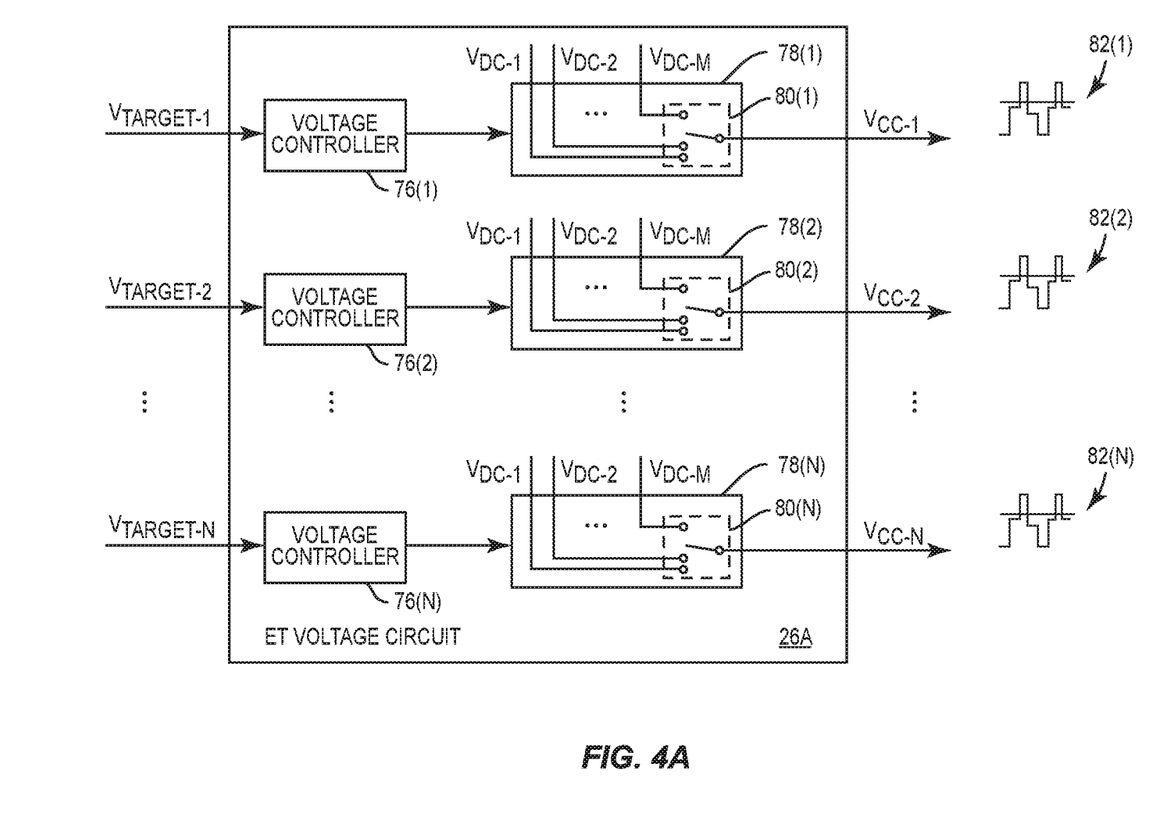
FIG. 4A is a schematic diagram of an exemplary ET voltage circuit, which can be configured according to one embodiment of the present disclosure to function as an ET voltage circuit in the ET circuit of FIG. 1 to generate a number of ET modulated voltages based on the ET target voltages of FIG. 2 and the constant voltages of FIG. 3.

FIG. 4A is a schematic diagram of an exemplary ET voltage circuit 26A, which can be configured according to one embodiment of the present disclosure to function as the ET voltage circuit 26 in the ET circuit 14 of FIG. 1 to generate the ET modulated voltages $V_{CC-1}$-$V_{DC-N}$ based on the ET target voltages $V_{TARGET-1}$-$V_{TARGET-N}$ of FIG. 2 and the constant voltages $V_{DC-1}$-$V_{DC-M}$ of FIG. 3. Common elements between FIGS. 1 and 4A are shown therein with common element numbers and will not be re-described herein.

The ET voltage circuit 26A includes a number of voltage controllers 76(1)-76(N) coupled to a number of voltage selection circuits 78(1)-78(N), respectively. Each of the voltage controllers 76(1)-76(N) can be a microcontroller or a field programmable gate array (FPGA), for example. Each of the voltage selection circuits 78(1)-78(N) is configured to receive the constant voltages $V_{DC-1}$-$V_{DC-M}$ from the supply voltage circuit 24. In a non-limiting example, the voltage selection circuits 78(1)-78(N) can be configured to include a number of switching circuits 80(1)-80(N). Each of the switching circuits 80(1)-80(N) can be controlled by a respective voltage controller to output a selected constant voltage among the constant voltages $V_{DC-1}$-$V_{DC-M}$ as a respective ET modulated voltage among the ET modulated voltages $V_{CC-1}$-$V_{CC-N}$. For example, the voltage controller 76(1) can control the switching circuit 80(1) in the voltage selection circuit 78(1) to output a selected one of the constant voltages $V_{DC-1}$-$V_{DC-M}$ as the ET modulated voltage $V_{CC-1}$. In this regard, the voltage selection circuits 78(1)-78(N) collectively output a number of selected constant voltages as the ET modulated voltages $V_{CC-1}$-$V_{CC-N}$, respectively.

Each of the voltage controllers 76(1)-76(N) can be configured to determine a selected constant voltage $V_{DC-S}$ among the constant voltages $V_{DC-1}$-$V_{DC-M}$ for a respective voltage selection circuit among the voltage selection circuits 78(1)-78(N) based on the equation (Eq. 4) below.

$$V_{DC-S} = \text{minimize } [V_{DC-j} \geq (V_{TARGET-i} + V_{Headroom})] \quad (1 \leq i \leq N)(1 \leq j \leq M) \quad \text{(Eq. 4)}$$

In the equation above, $V_{DC-j}$ represents any of the constant voltages $V_{DC-1}$-$V_{DC-M}$, $V_{TARGET-i}$ represents a respective ET target voltage among the ET target voltages $V_{TARGET-1}$-$V_{TARGET-N}$, and $V_{Headroom}$ represents a predefined headroom voltage (e.g., 0.9 V). In this regard, each of the voltage controllers 76(1)-76(N) can be configured to control the respective voltage selection circuit to output the selected constant voltage as being a smallest constant voltage among the constant voltages $V_{DC-1}$-$V_{DC-M}$ that is greater than or equal to the respective ET target voltage among the ET target voltages $V_{TARGET-1}$-$V_{TARGET-N}$. For example, the voltage controller 76(1) can control the voltage selection circuit 78(1) to output the smallest constant voltage among the constant voltages $V_{DC-1}$-$V_{DC-M}$ that is greater than or equal to the ET voltage $V_{TARGET-1}$ as the ET modulated voltage $V_{CC-1}$. Notably, the ET voltage circuit 26A is configured to generate the ET modulated voltages $V_{CC-1}$-$V_{CC-N}$ corresponding to a number of non-continuous voltage envelopes 82(1)-82(N), respectively.

Figure 4B:
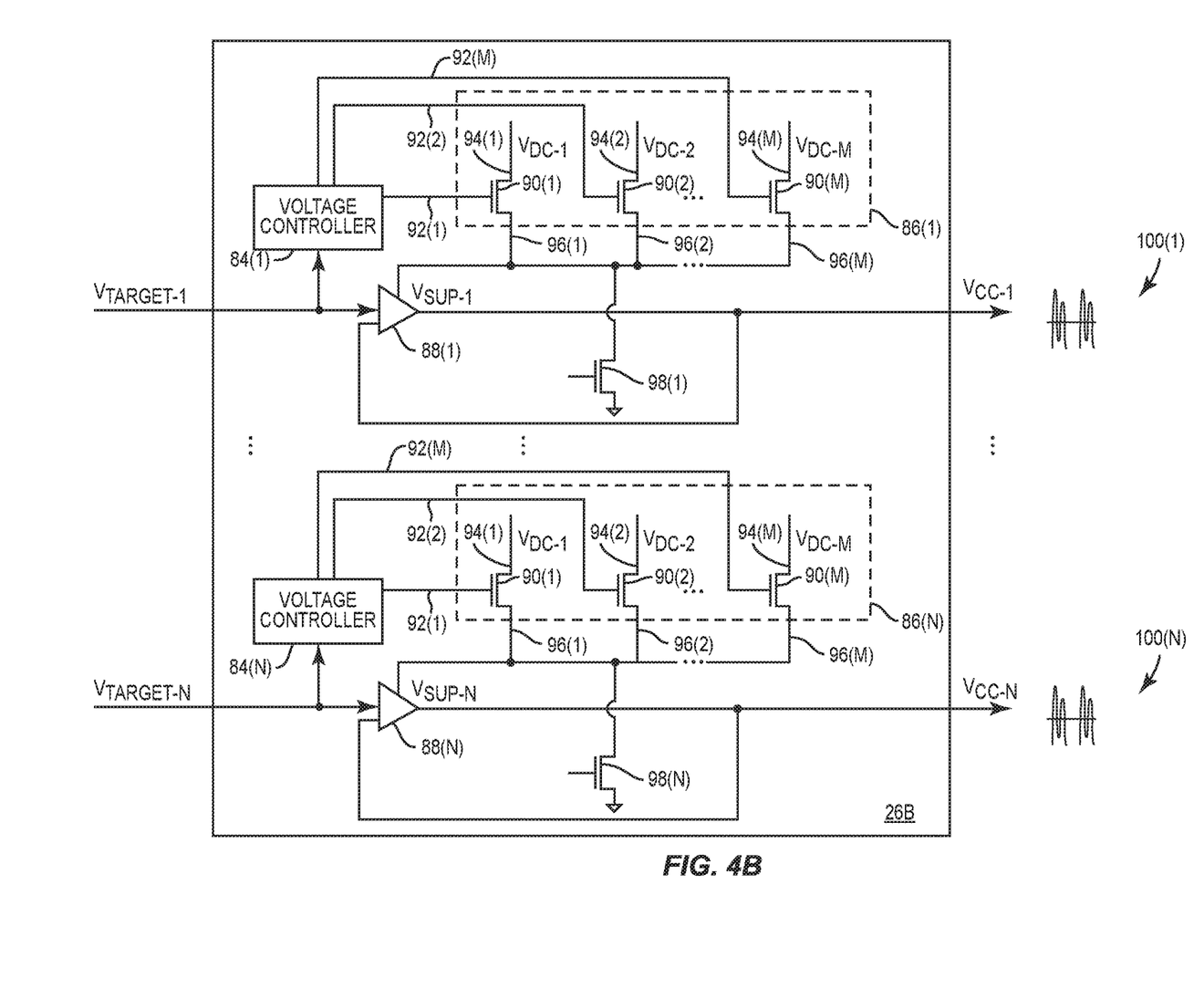
FIG. 4B is a schematic diagram of an exemplary ET voltage circuit, which can be configured according to another embodiment of the present disclosure to function as an ET voltage circuit in the ET circuit of FIG. 1 to generate a number of ET modulated voltages based on the ET target voltages of FIG. 2 and the constant voltages of FIG. 3.

FIG. 4B is a schematic diagram of an exemplary ET voltage circuit 26B, which can be configured according to one embodiment of the present disclosure to function as the ET voltage circuit 26 in the ET circuit 14 of FIG. 1 to generate the ET modulated voltages $V_{CC-1}$-$V_{CC-N}$ based on the ET target voltages $V_{TARGET-1}$-$V_{TARGET-N}$ of FIG. 2 and the constant voltages $V_{DC-1}$-$V_{DC-M}$ of FIG. 3. Common elements between FIGS. 1 and 4B are shown therein with common element numbers and will not be re-described herein.

The ET voltage circuit 26B includes a number of voltage controllers 84(1)-84(N) coupled to a number of voltage selection circuits 86(1)-86(N), respectively. Each of the voltage controllers 84(1)-84(N) can be a microcontroller or a field programmable gate array (FPGA), for example. The ET voltage circuit 26B includes a number of voltage amplifiers 88(1)-88(N) configured to output the ET modulated voltages $V_{CC-1}$-$V_{CC-N}$ based on the ET target voltages $V_{TARGET-1}$-$V_{TARGET-N}$ and a number of supply voltages $V_{SUP-1}$-$V_{SUP-N}$.

Each of the voltage selection circuits 86(1)-86(N) includes a number of field-effect transistors (FETs) 90(1)-90(M) provided in a serial arrangement. The FETs 90(1)-90(M) in each of the voltage selection circuits 86(1)-86(N) includes a number of gate electrodes 92(1)-92(M) coupled to a respective voltage controller among the voltage controllers 84(1)-84(N). The FETs 90(1)-90(M) in each of the voltage selection circuits 86(1)-86(N) include a number of drain electrodes 94(1)-94(M) coupled to the supply voltage circuit 24 to receive the constant voltages $V_{DC-1}$-$V_{DC-M}$, respectively. The FETs 90(1)-90(M) in each of the voltage selection circuits 86(1)-86(N) include a number of source electrodes 96(1)-96(M) coupled to a respective voltage amplifier among the voltage amplifiers 88(1)-88(N) to provide a respective supply voltage among the supply voltages $V_{SUP-1}$-$V_{SUP-N}$. The ET voltage circuit 26B includes a number of second FETs 98(1)-98(N) coupled respectively between the voltage selection circuits 86(1)-86(N) and the ground GND.

Each of the voltage controllers 84(1)-84(N) is configured to control a respective voltage selection circuit among the voltage selection circuits 86(1)-86(N) to output a selected constant voltage among the constant voltages $V_{DC-1}$-$V_{DC-M}$ to a respective voltage amplifier among the voltage amplifiers 88(1)-88(N) as a respective supply voltage among the supply voltages $V_{SUP-1}$-$V_{SUP-N}$. For example, the voltage controller 84(1) is configured to control the voltage selection circuit 86(1) to output any of the constant voltages $V_{DC-1}$-$V_{DC-M}$ to the voltage amplifier 88(1) as the supply voltage $V_{SUP-1}$. In this regard, the voltage selection circuits 86(1)-86(N) collectively output a number of selected constant voltages as the supply voltages $V_{SUP-1}$-$V_{SUP-N}$, respectively. Each of the voltage controllers 84(1)-84(N) may determine the respective constant voltage to be outputted from the respective voltage selection circuit based on the equation (Eq. 4) above.

By determining the supply voltages $V_{SUP-1}$-$V_{SUP-N}$ based on the ET target voltages $V_{TARGET-1}$-$V_{TARGET-N}$, it may be possible to cause the voltage amplifiers 88(1)-88(N) to operate with improved efficiency. Notably, the ET voltage circuit 26B is configured to generate the ET modulated voltages $V_{CC-1}$-$V_{CC-N}$ corresponding to a number of continuous voltage envelopes 100(1)-100(N), respectively.

Figure 4C:
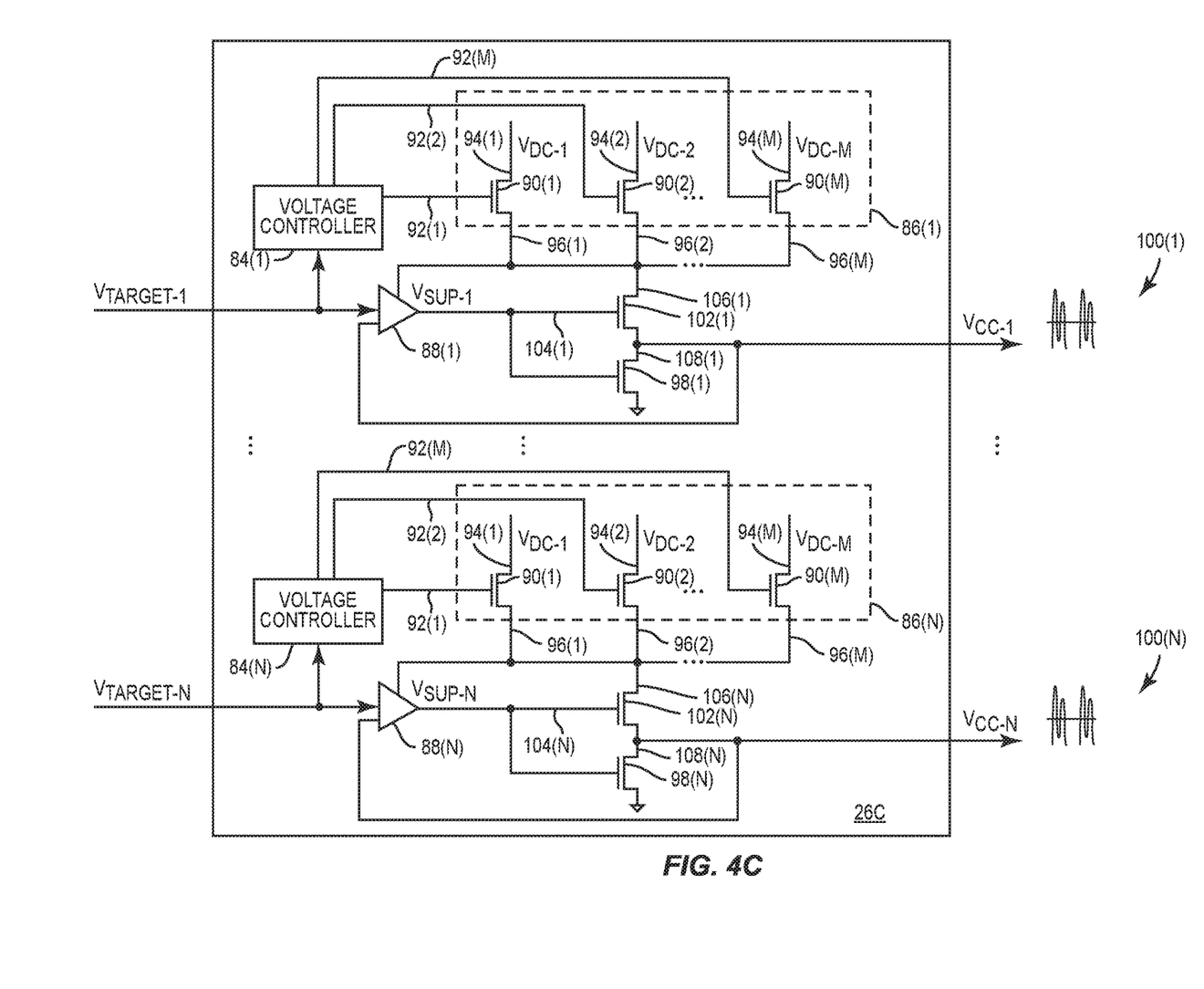
FIG. 4C is a schematic diagram of an exemplary ET voltage circuit, which can be configured according to another embodiment of the present disclosure to function as an ET voltage circuit in the ET circuit of FIG. 1 to generate a number of ET modulated voltages based on the ET target voltages of FIG. 2 and the constant voltages of FIG. 3.

FIG. 4C is a schematic diagram of an exemplary ET voltage circuit 26C, which can be configured according to one embodiment of the present disclosure to function as the ET voltage circuit 26 in the ET circuit 14 of FIG. 1 to generate the ET modulated voltages $V_{CC-1}$-$V_{CC-N}$ based on the ET target voltages $V_{TARGET-1}$-$V_{TARGET-N}$ of FIG. 2 and the constant voltages $V_{DC-1}$-$V_{DC-M}$ of FIG. 3. Common elements between FIGS. 1, 4B, and 4C are shown therein with common element numbers and will not be re-described herein.

The ET voltage circuit 26C further includes a number of linear FETs 102(1)-102(N), which can be p-type FETs (PFETs) for example. The linear FETs 102(1)-102(N) include a number of gate terminals 104(1)-104(N) coupled to the voltage amplifiers 88(1)-88(N), respectively. The linear FETs 102(1)-102(N) include a number of source terminals 106(1)-106(N) coupled to the voltage selection circuits 86(1)-86(N), respectively. The linear FETs 102(1)-102(N) include a number of drain terminals 108(1)-108(N) coupled to the second FETs 98(1)-98(N), respectively. The linear FETs 102(1)-102(N) are configured to output the ET modulated voltages $V_{CC-1}$-$V_{CC-N}$ respectively from the drain terminals 108(1)-108(N) with improved linearity.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) circuit comprising:
   a supply voltage circuit configured to generate a plurality of constant voltages;
   a target voltage circuit configured to generate a plurality of ET target voltages based on a reference target voltage; and
   an ET voltage circuit configured to:
   receive the plurality of constant voltages from the supply voltage circuit;
   receive the plurality of ET target voltages from the target voltage circuit; and generate a plurality of ET modulated voltages based on the plurality of ET target voltages and a selected constant voltage among the plurality of constant voltages.

2. The ET circuit of claim 1 wherein the target voltage circuit is further configured to:
   receive the reference target voltage corresponding to a dynamic voltage range;
   offset the reference target voltage to a baseline reference voltage corresponding to the dynamic voltage range;
   determine a plurality of slope factors;
   multiply the plurality of slope factors with the dynamic voltage range to generate the plurality of ET target voltages, respectively;
   adjust the plurality of ET target voltages based on a plurality of offset factors, respectively; and
   provide the plurality of ET target voltages to the ET voltage circuit.

3. The ET circuit of claim 2 wherein the target voltage circuit comprises:
   a first offset converter configured to offset the reference target voltage to the baseline reference voltage;
   a plurality of multipliers coupled in parallel to the first offset converter and configured to:
      receive the plurality of slope factors, respectively; and
      multiply the plurality of slope factors with the dynamic voltage range to generate the plurality of ET target voltages, respectively; and
   a plurality of second offset converters coupled to the plurality of multipliers and configured to:
      receive the plurality of offset factors, respectively; and
      adjust the plurality of ET target voltages based on the plurality of offset factors, respectively.

4. The ET circuit of claim 1 wherein the supply voltage circuit comprises:
   an inductor-based voltage circuit configured to generate a direct current (DC) voltage based on a battery voltage;
   a plurality of output ports configured to output the plurality of constant voltages, respectively, wherein:
      a first selected output port among the plurality of output ports is coupled to the inductor-based voltage circuit to output the DC voltage as a first selected constant voltage among the plurality of constant voltages; and
      one or more second selected output ports among the plurality of output ports are configured to output one or more second selected constant voltages among the plurality of constant voltages different from the first selected constant voltage;
   a capacitor-based voltage circuit coupled to the inductor-based voltage circuit and configured to generate the one or more second selected constant voltages at the one or more second selected output ports, respectively; and
   a controller configured to:
      receive a feedback signal indicative of a preselected constant voltage among the plurality of constant voltages; and
      control the inductor-based voltage circuit to adjust the DC voltage based on the preselected constant voltage.

5. The ET circuit of claim 4 wherein the capacitor-based voltage circuit is further configured to multiply the DC voltage with one or more predefined scaling factors to generate the one or more second selected constant voltages, respectively.

6. The ET circuit of claim 5 wherein the one or more predefined scaling factors are one or more fractional scaling factors.

7. The ET circuit of claim 6 wherein the one or more second selected output ports are further configured to output the one or more second selected constant voltages in ascending voltage values.

8. The ET circuit of claim 4 wherein the supply voltage circuit further comprising a clock generator configured to generate an operating clock for the capacitor-based voltage circuit based on a reference clock configured to operate the controller.

9. The ET circuit of claim 1 wherein the ET voltage circuit comprises:
   a plurality of voltage selection circuits each configured to receive the plurality of constant voltages from the supply voltage circuit; and
   a plurality of voltage controllers configured to receive the plurality of ET target voltages, respectively, each of the plurality of voltage controllers is further configured to control a respective voltage selection circuit among the plurality of voltage selection circuits to output the selected constant voltage among the plurality of constant voltages as a respective ET modulated voltage among the plurality of ET modulated voltages.

10. The ET circuit of claim 9 wherein each of the plurality of voltage controllers is further configured to:
    determine the selected constant voltage as equal to minimize $[V_{DC-j} \geq (V_{TARGET-i} + V_{Headroom})]$ $(1 \leq i \leq N)$ $(1 \leq j \leq M)$, wherein:
       $V_{DC-j}$ represents any of the plurality of constant voltages;
       $V_{TARGET-i}$ represents a respective ET target voltage among the plurality of ET target voltages; and
       $V_{Headroom}$ represents a predefined headroom voltage; and
    control the respective voltage selection circuit to output the selected constant voltage as the respective ET modulated voltage among the plurality of ET modulated voltages.

11. The ET circuit of claim 1 wherein the ET voltage circuit comprises:
    a plurality of voltage selection circuits each configured to receive the plurality of constant voltages from the supply voltage circuit;
    a plurality of voltage amplifiers configured to generate the plurality of ET modulated voltages based on the plurality of ET target voltages and a plurality of supply voltages, respectively; and
    a plurality of voltage controllers configured to receive the plurality of ET target voltages, respectively, each of the plurality of voltage controllers is further configured to control a respective voltage selection circuit among the plurality of voltage selection circuits to output the selected constant voltage among the plurality of constant voltages to a respective voltage amplifier among the plurality of voltage amplifiers as a respective supply voltage among the plurality of supply voltages.

12. The ET circuit of claim 11 wherein the ET voltage circuit further comprises a plurality of linear field-effect transistors (FETs) having a plurality of gate terminals coupled to the plurality of voltage amplifiers and a plurality of drain terminals configured to output the plurality of ET modulated voltages, respectively.

13. An envelope tracking (ET) power amplifier apparatus comprising:
    a plurality of amplifier circuits configured to amplify a radio frequency (RF) signal based on a plurality of ET modulated voltages, respectively; and an ET circuit coupled to the plurality of amplifier circuits and comprising:
  a supply voltage circuit configured to generate a plurality of constant voltages;
  a target voltage circuit configured to generate a plurality of ET target voltages based on a reference target voltage; and
  an ET voltage circuit configured to:
    receive the plurality of constant voltages from the supply voltage circuit;
    receive the plurality of ET target voltages from the target voltage circuit;
    generate the plurality of ET modulated voltages based on the plurality of ET target voltages and a selected constant voltage among the plurality of constant voltages; and
    provide the plurality of ET modulated voltages to the plurality of amplifier circuits, respectively.

14. The ET power amplifier apparatus of claim 13 wherein:
  the plurality of amplifier circuits is further configured to amplify the RF signal associated with a plurality of time-variant power envelopes, respectively; and
  the target voltage circuit is further configured to modulate the plurality of ET target voltages to a plurality of time-variant target voltage envelopes configured to track the plurality of time-variant power envelopes, respectively.

15. The ET power amplifier apparatus of claim 14 wherein the target voltage circuit is further configured to:
  receive the reference target voltage corresponding to a dynamic voltage range;
  offset the reference target voltage to a baseline reference voltage corresponding to the dynamic voltage range;
  determine a plurality of slope factors corresponding to the plurality of time-variant power envelopes;
  multiply the plurality of slope factors with the dynamic voltage range to generate the plurality of ET target voltages, respectively;
  adjust the plurality of ET target voltages based on a plurality of offset factors, respectively; and
  provide the plurality of ET target voltages to the ET voltage circuit.

16. The ET power amplifier apparatus of claim 15 wherein the target voltage circuit comprises:
  a first offset converter configured to offset the reference target voltage to the baseline reference voltage;
  a plurality of multipliers coupled in parallel to the first offset converter and configured to:
    receive the plurality of slope factors, respectively; and
    multiply the plurality of slope factors with the dynamic voltage range to generate the plurality of ET target voltages, respectively; and
  a plurality of second offset converters coupled to the plurality of multipliers and configured to:
    receive the plurality of offset factors, respectively; and
    adjust the plurality of ET target voltages based on the plurality of offset factors, respectively.

17. The ET power amplifier apparatus of claim 13 wherein the supply voltage circuit comprises:
  an inductor-based voltage circuit configured to generate a direct current (DC) voltage based on a battery voltage;
  a plurality of output ports configured to output the plurality of constant voltages, respectively, wherein:
    a first selected output port among the plurality of output ports is coupled to the inductor-based voltage circuit to output the DC voltage as a first selected constant voltage among the plurality of constant voltages; and
    one or more second selected output ports among the plurality of output ports are configured to output one or more second selected constant voltages among the plurality of constant voltages different from the first selected constant voltage;
  a capacitor-based voltage circuit coupled to the inductor-based voltage circuit and configured to generate the one or more second selected constant voltages at the one or more second selected output ports, respectively; and
  a controller configured to:
    receive a feedback signal indicative of a preselected constant voltage among the plurality of constant voltages; and
    control the inductor-based voltage circuit to adjust the DC voltage based on the preselected constant voltage.

18. The ET power amplifier apparatus of claim 17 wherein the capacitor-based voltage circuit is further configured to multiply the DC voltage with one or more predefined scaling factors to generate the one or more second selected constant voltages, respectively.

19. The ET power amplifier apparatus of claim 18 wherein the one or more predefined scaling factors are one or more fractional scaling factors.

20. The ET power amplifier apparatus of claim 19 wherein the one or more second selected output ports are further configured to output the one or more second selected constant voltages in ascending voltage values.

21. The ET power amplifier apparatus of claim 17 wherein the supply voltage circuit further comprises a clock generator configured to generate an operating clock for the capacitor-based voltage circuit based on a reference clock configured to operate the controller.

22. The ET power amplifier apparatus of claim 13 wherein the ET voltage circuit comprises:
  a plurality of voltage selection circuits each configured to receive the plurality of constant voltages from the supply voltage circuit; and
  a plurality of voltage controllers configured to receive the plurality of ET target voltages, respectively, each of the plurality of voltage controllers is further configured to control a respective voltage selection circuit among the plurality of voltage selection circuits to output the selected constant voltage among the plurality of constant voltages as a respective ET modulated voltage among the plurality of ET modulated voltages.

23. The ET power amplifier apparatus of claim 22 wherein each of the plurality of voltage controllers is further configured to:
  determine the selected constant voltage as equal to minimize $[V_{DC-j} \geq (V_{TARGET-i} + V_{Headroom})]$ $(1 \leq i \leq N)$ $(1 \leq j \leq M)$, wherein:
    $V_{DC-j}$ represents any of the plurality of constant voltages;
    $V_{TARGET-i}$ represents a respective ET target voltage among the plurality of ET target voltages; and
    $V_{Headroom}$ represents a predefined headroom voltage; and
  control the respective voltage selection circuit to output the selected constant voltage as the respective ET modulated voltage among the plurality of ET modulated voltages.

24. The ET power amplifier apparatus of claim 13 wherein the ET voltage circuit comprises:

a plurality of voltage selection circuits each configured to receive the plurality of constant voltages from the supply voltage circuit;

a plurality of voltage amplifiers configured to generate the plurality of ET modulated voltages based on the plurality of ET target voltages and a plurality of supply voltages, respectively; and a plurality of voltage controllers configured to receive the plurality of ET target voltages, respectively, each of the plurality of voltage controllers is further configured to control a respective voltage selection circuit among the plurality of voltage selection circuits to output the selected constant voltage among the plurality of constant voltages to a respective voltage amplifier among the plurality of voltage amplifiers as a respective supply voltage among the plurality of supply voltages.

25. The ET power amplifier apparatus of claim 24 wherein the ET voltage circuit further comprises a plurality of linear field-effect transistors (FETs) having a plurality of gate terminals coupled to the plurality of voltage amplifiers and a plurality of drain terminals configured to output the plurality of ET modulated voltages, respectively.

* * * * *

UNITED STATES PATENT AND TRADEMARK OFFICE
CERTIFICATE OF CORRECTION

PATENT NO. : 10,951,175 B2
APPLICATION NO. : 16/250229
DATED : March 16, 2021
INVENTOR(S) : Nadim Khlat Page 1 of 1

It is certified that error appears in the above-identified patent and that said Letters Patent is hereby corrected as shown below:

In the Specification

Column 5, Line 19, replace "signal 201" with --signal 20I--.
Column 5, Line 20, replace "signal 200" with --signal 20Q--.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*